(12) United States Patent
Ju

(10) Patent No.: US 6,948,946 B1
(45) Date of Patent: Sep. 27, 2005

(54) IC SOCKET

(76) Inventor: Ted Ju, P.O. Box 26-757, Taipei 106 (TW)

( * ) Notice: Subject to any disclaimer, the term of this patent is extended or adjusted under 35 U.S.C. 154(b) by 0 days.

(21) Appl. No.: 10/831,696

(22) Filed: Apr. 22, 2004

(51) Int. Cl.⁷ ............................................ H01R 12/00
(52) U.S. Cl. ...................................................... 439/71
(58) Field of Search ......................... 439/71, 330, 331, 439/73

(56) References Cited

U.S. PATENT DOCUMENTS

| | | | | |
|---|---|---|---|---|
| 5,106,309 | A | * | 4/1992 | Matsuoka et al. ............. 439/71 |
| 5,352,131 | A | * | 10/1994 | Nagumo ..................... 439/266 |
| 6,062,874 | A | * | 5/2000 | Matsuda et al. .............. 439/73 |
| 6,152,744 | A | * | 11/2000 | Maeda ........................ 439/71 |

* cited by examiner

*Primary Examiner*—Phuong Dinh
(74) *Attorney, Agent, or Firm*—Rosenberg, Klein & Lee

(57) ABSTRACT

An IC socket includes an insulating housing having a plurality of wall blocks defining a plurality of slanting passageways penetrating inclined therethrough and a limit portion downwardly extending therefrom, a plurality of contacts received correspondingly in the slanting passageways respectively, and at least two orientation posts disposed downwardly from the limit portion. Each of the contacts is resilient and in an U shape, and has fist and second abutting portions exposing out of opposing sides of the bottom wall of the insulating housing respectively. The IC module accommodates with the insulating housing, the PCB and the IC modules include a plurality of conductive patterns and pads disposed thereon respectively, so as to correspond to the contacts relatively, the first abutting portion consequently retains against each of the conductive patterns and the second abutting portion retains against each of the pads.

13 Claims, 4 Drawing Sheets

IC SOCKET

BACKGROUND OF THE INVENTION

1. Field of the Invention

The present invention relates to an IC socket, and particularly relates to an IC socket adopted for an IC module and a printed circuit board, which both have a plurality of pads respectively, and providing a plurality of contacts corresponding to the pads resiliently.

2. Background of the Invention

There are at least two ways to place an integrated circuit (IC) package on a main board. In one of the two ways, the IC is soldered fixedly on the main board and cannot be removed. In another way, the IC is replaceable. With respect to FIG. 1, a first conventional electrical socket 10a is adopted for mounting an IC module 20a having a plurality of pins 21a to a main board 30a, which has a plurality of conductive patterns 31a thereof. The first conventional electrical socket 10a includes a housing 11a, a plurality of passageways 12a formed on the housing and accommodating with the pins 21a of the IC module 20a, and a plurality of solder balls 13a positioned to the housing 11a and aligned with the passageways 12a respectively. The solder balls 13a connect the pins 21a and conductive patterns 31a respectively, when the solder balls 21a melt over a predetermined temperature. However, the pins 21a of the IC module 20a may damage when inserting into the passageways 12a due to incorrect alignment and oblique insertion. A short between any two adjacent pins 21a may happen because the solder balls 13a are over-quantity and melt to combine with each other. When removing the integrated circuit from the circuit board 30a, it is necessary to remove the solder completely from the integrated circuit, and this work is difficult, difficulty will increase by the number of pins 21a thereof. Pins 21a often deform and bend when removing IC module 20a from the main board 30a, and cannot be applied furthermore. Furthermore, the first conventional electrical socket 10a has to be thrown away while one of the main board 30a and the IC module 20a doesn't work, even though there are another functional modules that still work on the main board 30a. Both of the main board 30a and the IC module 20a damage can cause lots of costs and wastrels.

Referring to FIG. 2, a second conventional electrical socket 10b is adopted for mounting an IC module 20b having a plurality of pads 21b to a main board 30b, which has a plurality of conductive patterns 31b thereof. The second conventional electrical socket 10b includes a housing 11b having a plurality of passageways 12b inclined penetrating through thereof, a plurality of contacts 14b accommodating with the passageways 12b and each having an arced end exposing out of an upper surface of the housing, and a plurality of solder balls 13b positioned to the housing and aligned with the passageways 31b respectively. Each of the contacts 14b has a predetermined configuration to retain against in each of the passageways, and the solder balls 13b connect the contacts 14b and conductive patterns 31b respectively when the solder balls 13b melt over a predetermined temperature, the contacts 14b accordingly can electrically connect the pads 21b of the IC module 20b and the conductive patterns 31b of the main board 30b, the IC module 20b can be replaceable and disposed in the second electrical socket 10b thereby. Although the IC module 20b can be removed therefrom while one of the main board 30b and the IC module 20b doesn't work, the second conventional electrical socket 10b still has some problems as descried above. A short between any two adjacent contacts 14b may happen because the solder balls 13b are over-quantity and melt to combine with each other. Further, for orientating the solder balls 13b in the passageways 12b, there are still several steps in the manufacturing process, but the costs still cannot be cut down. In the case, another packages or modules can be kept while the IC module 20b is out of work and needs to be removed.

Hence, an improvement over the prior art is required to overcome the disadvantages thereof.

SUMMARY OF INVENTION

The primary object of the invention is therefore to specify an IC socket that can adopt for an IC module having a plurality of the pads.

The secondary object of the invention is therefore to specify an IC socket that can provides contacts each having two resilient ends exposing out thereof respectively and abutting against the pads of the IC module and conductive patterns of a printed circuit board.

The third object of the invention is therefore to specify an IC socket that can avoid a soldering process cutting down costs and manufacturing steps.

The fourth object of the invention is therefore to specify an IC socket that can prevent a soldering process form problems, for example, a short between any two adjacent contacts thereof.

According to the invention, the object is achieved by an IC socket, which includes an insulating housing having a plurality of wall blocks defining a plurality of slanting passageways penetrating inclined therethrough and a limit portion downwardly extending therefrom, a plurality of contacts received correspondingly in the slanting passageways respectively, and at least two orientation posts disposed downwardly from the limit portion. Each of the contacts is resilient and in an U shape, and has fist and second abutting portions exposing out of opposing sides of the bottom wall of the insulating housing respectively. The PCB has at least two orientation holes corresponding to the two orientation posts to receive the two orientation posts respectively. The IC module accommodates with the insulating housing, the PCB and the IC modules include a plurality of conductive patterns and pads disposed thereon respectively, so as to correspond to the contacts relatively, the first abutting portion consequently retains against each of the conductive patterns and the second abutting portion retains against each of the pads. Whereby the contacts are capable of deforming and supporting the IC module in a compression manner, and the IC module electrically connects the PCB via the contacts thereby.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings where:

FIG. 3 is a perspective view of an IC socket according to the present invention, before an IC module accommodates in;

FIG. 6 is a perspective view according to the IC socket according to the present invention, after an IC module accommodates in;

DETAILED DESCRIPTION OF THE EMBODIMENTS

Figure 1:
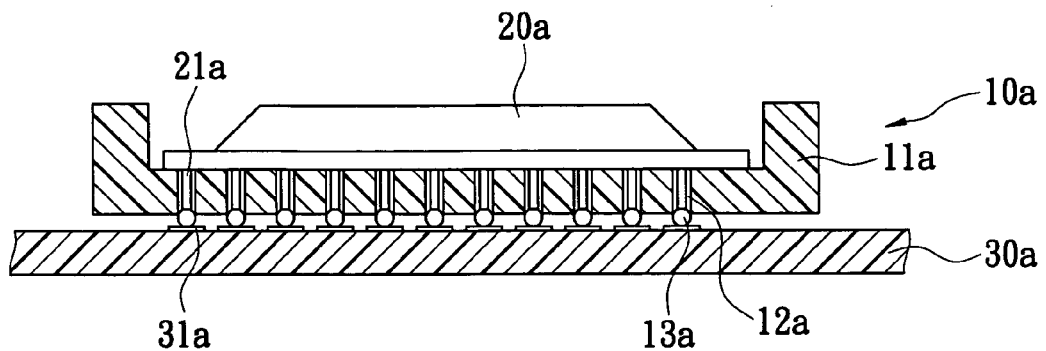
FIG. 1 is a perspective view according to a first conventional electrical socket.
Figure 2:
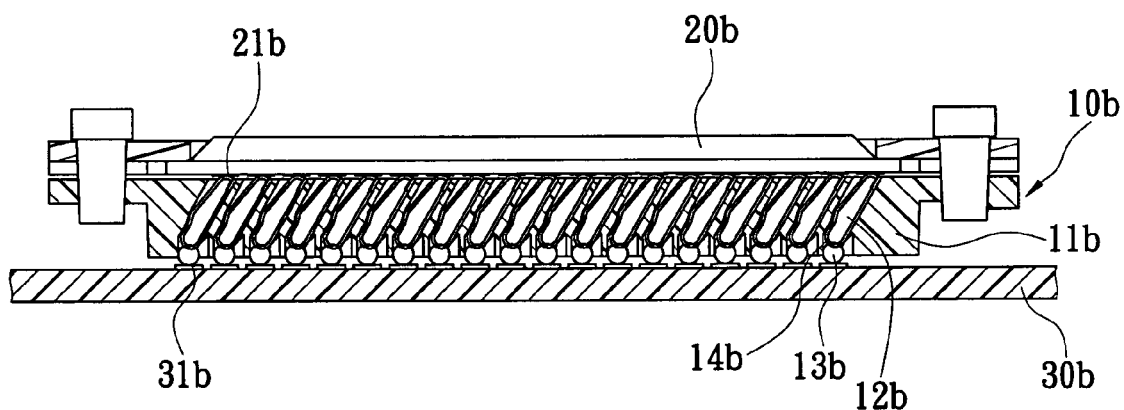
FIG. 2 is a perspective view according to a second conventional electrical socket.
Figure 3:
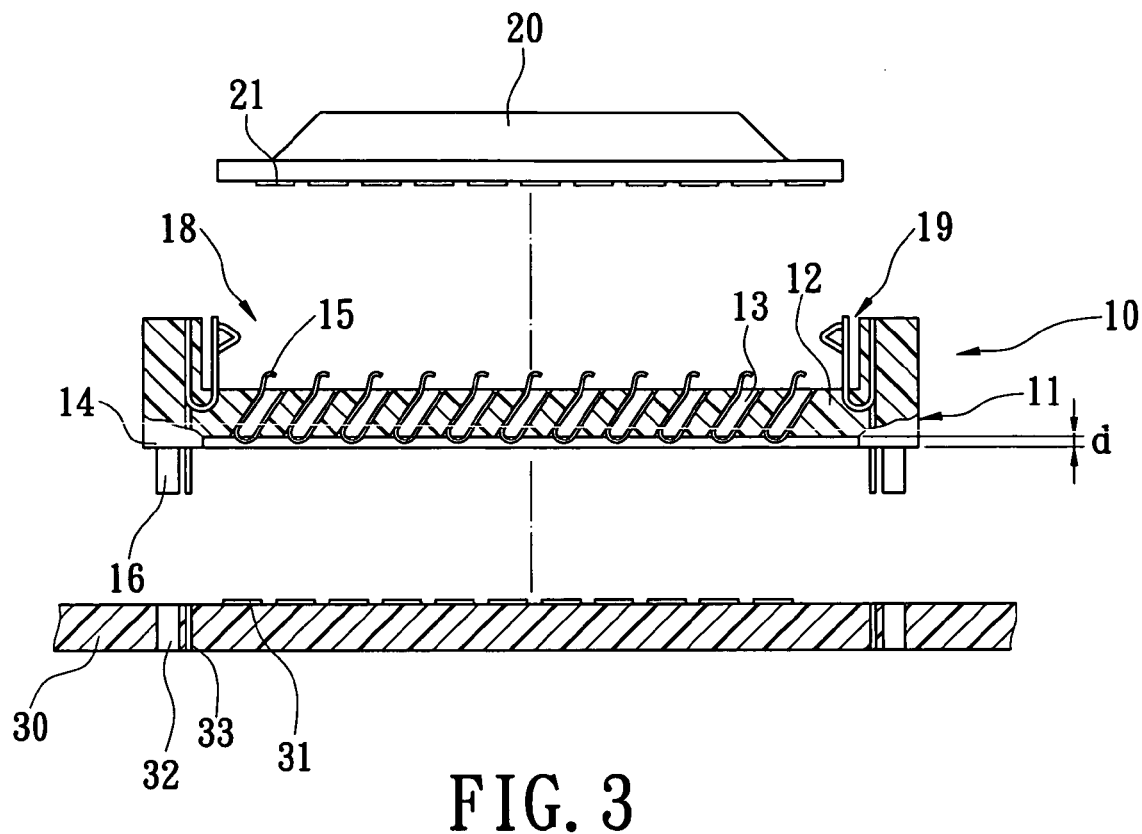

Referring to FIGS. 3, 4, 6 and 7, the present invention discloses an IC socket 10 adopted for electrically connecting an IC module 20 to a printed circuit board (PCB) 30, the IC socket 10 includes an insulating housing 11 having a plurality of wall blocks defining a plurality of slanting passageways 13 penetrating inclined therethrough and a limit portion 14 downwardly extending therefrom, a plurality of contacts 15 received correspondingly in the slanting passageways 13 respectively, and at least two orientation posts 16 disposed downwardly from the limit portion 14. Wherein the insulating housing 11 includes a bottom wall 12, the slanting passageways 13 penetrating inclined though the bottom wall 12, and the limit portion 14 downwardly extending from a circumstance of the bottom wall 12. Each of the contacts 15 is disposed obliquely with a predetermined angle θ to receive in each of the slanting passageways 13. In addition, each of the contacts 15 is resilient and in an U shape, and has fist and second abutting portions 151, 152 exposing out of opposing sides of the bottom wall 12 of the insulating housing 11 respectively. The PCB 30 has at least two orientation holes 32 corresponding to the two orientation posts 16 to receive the two orientation posts 16 respectively. The IC module 20 accommodates with the insulating housing, and furthermore the insulating housing 11 includes a frame 17 upwardly protruding from the circumstance of the bottom wall 12 and defines a cavity 18 to receive the IC module 20 therein. The PCB 30 and the IC module 20 include a plurality of conductive patterns 31 and pads 21 disposed thereon respectively, so as to correspond to the contacts 15 relatively, the first abutting portion 151 thereof consequently retains against each of the conductive patterns 31 and the second abutting portion 152 thereof retains against each of the pads 21. The limit portion 14 has a predetermined height d thereof to prevent the contacts 15 from over compression. Whereby the contacts 15 are capable of deforming and supporting the IC module 20 in a compression manner, and the IC module electrically connecting the PCB via the contacts thereby.

Figure 4:
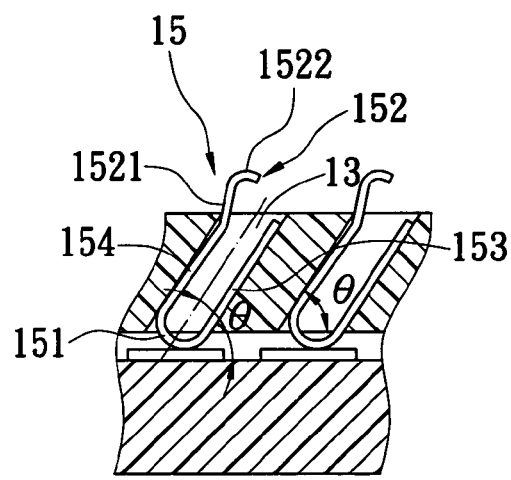
FIG. 4 is an enlarged view of a first embodiment of a contact according to FIG. 3.

Illustrated as FIG. 4, the first and the second abutting portions 151, 152 are in curved shapes, each of the contacts 15 has first and second resilient arms 153, 154 extending upwardly from opposing ends of the first abutting portion 151, and the second abutting portion 152 connects the second resilient arm 154. Wherein the first abutting portion 151 exposes out of a lower surface of the bottom wall 12 of the insulating housing 11, and the second abutting portion 152 exposes out of an upper surface of the bottom wall 12 of the insulating housing 11. The first and the second resilient arms 153, 154 retain against two opposing inner walls of each of the wall blocks respectively and simultaneously while the IC module 20 is in a compression manner. Similarly, the slanting passageways 13 formed with the predetermined angle θ, thus the first and second resilient arms 153, 154 parallel to contact two opposing inner walls of each of the wall blocks while the IC module 20 is removed away.

Figure 5:
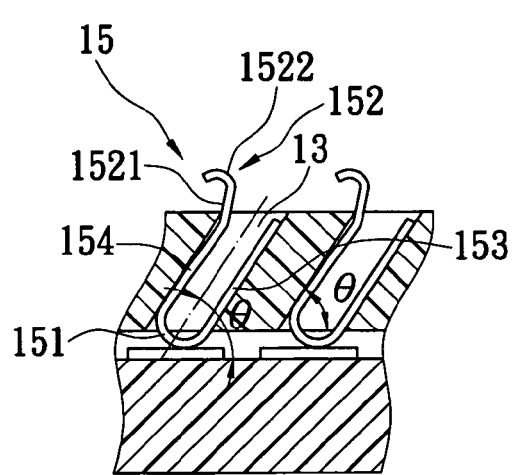
FIG. 5 is an enlarged view of a second embodiment of the contact according to the present invention.

With respect to FIGS. 4 and 5 simultaneously, the second abutting portion 152 includes a deviation portion 1521 extending upwardly from the second resilient arm 154 and a tail portion 1522 connecting the deviation portion 1522. The deviation portion 1521 approaching a vertical, and the tail portion 1522 bends outwardly or inwardly to be curved.

The IC socket 10 further includes at least two inverted h-shaped members 19 arranged the circumstance of the bottom wall 12 of the insulating housing 11, each of the two inverted h-shaped members 19 has an elongated portion 191 disposed in the frame 17, a bent portion 192 extending from the elongated portion 191 and exposing out of the upper surface of the bottom wall 12, and a buckling portion 193 disposed on an exterior side of the bent portion 192. The buckling portion 193 is utilized to slightly orientate a circumstance of the IC module 20, and has a guiding surface 194 formed thereon and is slippery for the IC module 20 arranged therein smoothly. Each of the two inverted h-shaped members 19 is made of flexible metallic materials. The elongated portion 191 extends downwardly to expose out of the limit portion 14 relatively, so as to penetrate through a slit 33 that corresponds to the elongated portion 191 and arranges on the PCB 30. For another goal, the two inverted h-shaped members 19 provides grounding functions from the IC module 20, such as shielded grounding, or signal grounding, to avoid interaction therebetween.

Figure 6:
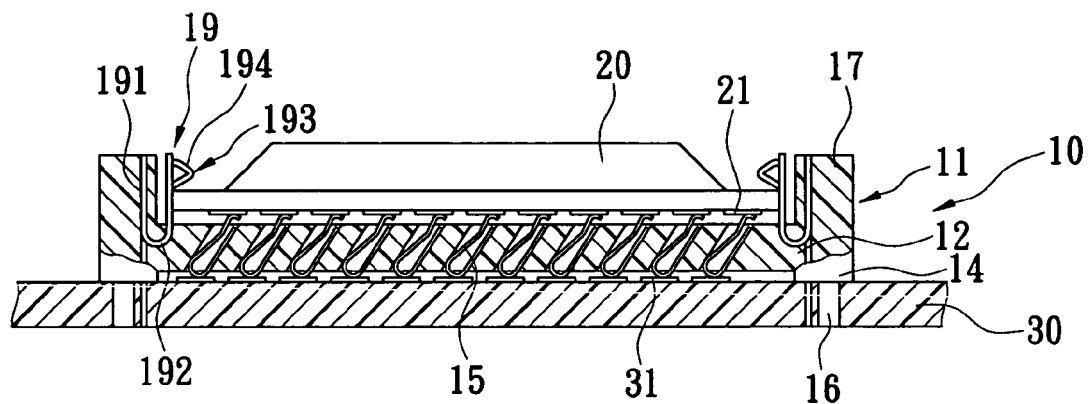
Figure 7:
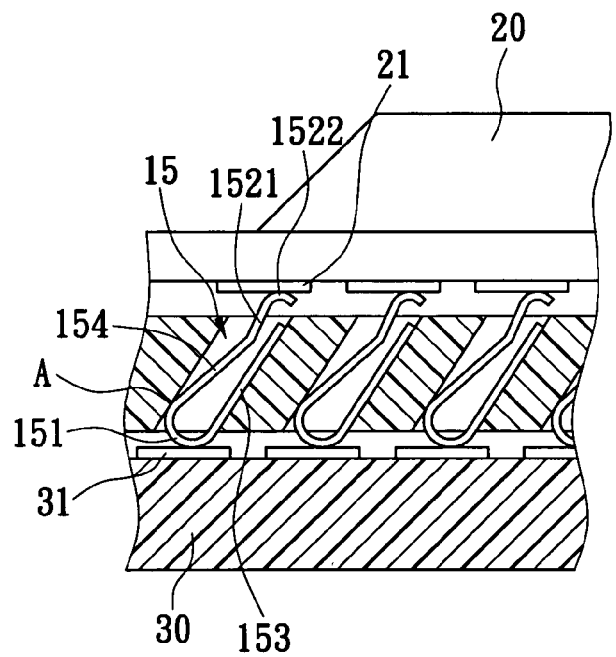
FIG. 7 is an enlarged view of the IC socket according to FIG. 4 according to FIG. 6.

When the IC module 20 loads on the IC socket 10, first to be smoothly lead in the cavity 18 via the guiding surface 194 thereof as illustrated in FIGS. 6 and 7, and second to press the contacts 15 with a weight thereof. The contacts 15 that are resilient and bear the weight of the IC module 20 start to deform, the second resilient arm 164 abuts against one of the inner walls of the wall blocks of the insulating housing 11 at an A point thereof, and the first resilient arm 163 contacts the other of the inner walls of the wall blocks of the insulating housing 11 to get a reacting force to balance the deformation of any of the second resilient arm 164a, the deviation portion 1521 an the tail portion 1522. The IC module 20 is orientated by the bent portion 192 and the buckling portion 193 of the two inverted h-shaped members 19. The bent portion 192 retains against a side of the IC module 20, and the buckling portion 193 restricts the IC module 20 to avoid upward movement due to the reacting force of the contacts 15.

Figure 8:
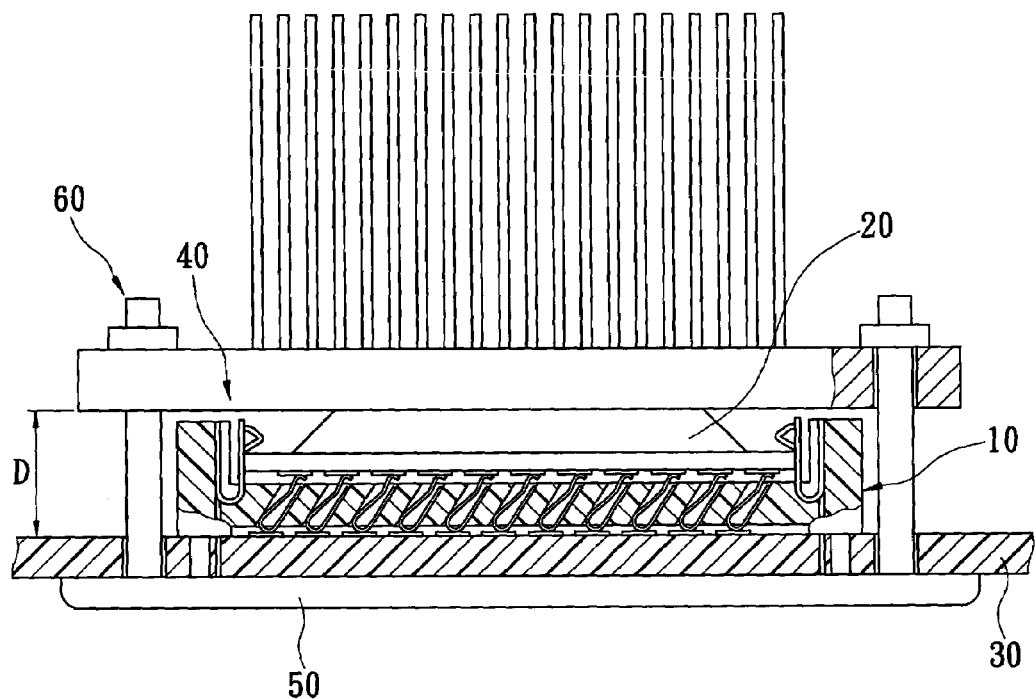
FIG. 8 is a perspective view according to an application of the IC socket.

According to an application of the IC socket shown in FIG. 8, after the IC module 20 accommodates with the IC socket 10 to electrically connect the PCB 30, there is further a heat sink 40 disposed over the IC module 20 for heat dissipation from the IC module 20. It is well known to a person in the skilled art that the heat sink 40 adopts for the IC module 20. In addition, a substrate 50 is applied under the PCB 30 and corresponds the heat sink 40; a plurality of security members 60 connects the heat sink 40 to the substrate 50 by securing the PCB 30 therebetween. The heat sink 40 contacts the IC module 20 tightly due to the security members 60, which can be screws penetrating through the PCB 30 to connect the substrate 60. Each of the security members 60 has a predetermined length for the heat sink spacing a predetermined distance D from the PCB 30, the contacts 15 accordingly prevent over compression.

The present invention provides the IC socket 10 with the contacts 15 exposing out of opposing sides thereof to retain against the pads 21 of the IC module 20 and the conductive pads 31 of the PCB 30 respectively without soldering process. The IC module 20 can be removed from the IC socket, if there are some damages thereof, the IC socket 10 needs no soldering processes to contact the PCB 30 well and save costs. Consequently, this is a great advancement in the intense competition art.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An integrated circuit (IC) socket adapted for electrically connecting an IC module to a printed circuit board (PCB), the IC socket comprising:
    an insulating housing including a bottom wall, a plurality of slanting passageways penetrating inclined through the bottom wall, and a limit portion downwardly extending from a circumstance of the bottom wall;
    a plurality of contacts received correspondingly in the slanting passageways respectively, each of the contacts being resilient and in an U shape, and having fist and second abutting portions exposing out of opposing sides of the bottom wall of the insulating housing respectively; and
    at least two orientation posts disposed downwardly from the limit portion, and the PCB having at least two orientation holes corresponding to the two orientation posts to receive the two orientation posts respectively;
    wherein the IC module accommodates with the insulating housing, the PCB and the IC modules include a plurality of conductive patterns and pads disposed thereon respectively, so as to correspond to the contacts relatively, the first abutting portion consequently retains against each of the conductive patterns and the second abutting portion retains against each of the pads;
    whereby the contacts are capable of deforming and supporting the IC module in a compression manner, each of the contacts has first and second resilient arms disposed against two opposing inner surfaces of a corresponding slanting passageway, and the IC module electrically connecting the PCB via the contacts thereby.

2. The IC socket as claimed in claim 1, wherein the first and the second abutting portions are in curved shapes, the first and second resilient arms of each contact extend upwardly from two opposing ends of the first abutting portion, and the second resilient arm connects to the second abutting portion, the first abutting portion exposes out of a lower surface of the bottom wall of the insulating housing, and the second abutting portion exposes out of an upper surface of the bottom wall of the insulating housing.

3. The IC socket as claimed in claim 2, wherein each of the contacts is disposed obliquely with a predetermined angle to receive in each of the slanting passageways.

4. The IC socket as claimed in claim 3, wherein the slanting passageways are formed with the predetermined angle, the first and second resilient arms being disposed in parallel to contact two opposing inner surfaces of each slanting passageway when the IC module is removed.

5. The IC socket as claimed in claim 2, wherein the second abutting portion includes a deviation portion extending upwardly from the second resilient arm and a tail portion connecting the deviation portion.

6. The IC socket as claimed in claim 5, wherein the deviation portion approaching a vertical, and the tail portion bends to be curved.

7. The IC socket as claimed in claim 6, wherein the tail portion bends outwardly or inwardly.

8. The IC socket as claimed in claim 1, wherein the limit portion has a predetermined height thereof to prevent the contacts from over compression.

9. The IC socket as claimed in claim 1, wherein the insulating housing includes a frame upwardly protruding from a circumstance of the bottom wall being a cavity to receive the IC module therein.

10. The IC socket as claimed in claim 9, further including at least two guiding members, each guiding member having an elongated portion disposed in the frame, a bent portion extending from the elongated portion and exposing out of the upper surface of the bottom wall, and a buckling portion disposed on an exterior side of the bent portion.

11. The IC socket as claimed in claim 10, wherein the buckling portion has a guiding surface formed thereon and being slippery for the IC module arranged therein smoothly.

12. The IC socket as claimed in claim 10, wherein the elongated portion extends downwardly to expose out of the limit portion relatively, so as to penetrate through a slit that corresponds to the elongated portion and arranges on the PCB.

13. The IC socket as claimed in claim 10, wherein each of the two guiding members is made of a flexible metallic material.

\* \* \* \* \*